(12) United States Patent
Seo

(10) Patent No.: US 7,227,483 B2
(45) Date of Patent: Jun. 5, 2007

(54) HIGH-SPEED AND HIGH-ACCURACY DIGITAL-TO-ANALOG CONVERTER

(76) Inventor: Dongwon Seo, 4159 Twilight Ridge, San Diego, CA (US) 92130

( * ) Notice: Subject to any disclaimer, the term of this patent is extended or adjusted under 35 U.S.C. 154(b) by 0 days.

(21) Appl. No.: 10/947,980

(22) Filed: Sep. 22, 2004

(65) Prior Publication Data

US 2006/0061499 A1 Mar. 23, 2006

(51) Int. Cl.
*H03M 1/66* (2006.01)
(52) U.S. Cl. ............... 341/144; 341/145; 341/118
(58) Field of Classification Search ........... 341/144, 341/118, 145; 323/269; 370/487
See application file for complete search history.

(56) References Cited

U.S. PATENT DOCUMENTS

| | | | | |
|---|---|---|---|---|
| 5,012,178 | A * | 4/1991 | Weiss et al. ............... 323/269 |
| 5,257,027 | A * | 10/1993 | Murota ....................... 341/153 |
| 5,572,099 | A * | 11/1996 | Carobolante ............... 318/434 |
| 5,949,793 | A * | 9/1999 | Bossard et al. ............. 370/487 |
| 5,955,980 | A * | 9/1999 | Hanna ........................ 341/120 |
| 6,075,473 | A * | 6/2000 | Masuda ...................... 341/118 |
| 6,246,351 | B1 * | 6/2001 | Yilmaz ....................... 341/145 |
| 6,249,876 | B1 * | 6/2001 | Balakrishnan et al. ...... 713/501 |
| 6,339,391 | B1 * | 1/2002 | Chung et al. ............... 341/153 |
| 6,608,579 | B2 * | 8/2003 | Kurooka ..................... 341/144 |
| 6,639,534 | B2 * | 10/2003 | Khoini-Poorfard et al. . 341/144 |
| 6,703,956 | B1 * | 3/2004 | Mueller et al. ............. 341/145 |
| 6,822,595 | B1 * | 11/2004 | Robinson .................... 341/144 |
| 2003/0223525 | A1 * | 12/2003 | Momtaz et al. |
| 2004/0048591 | A1 * | 3/2004 | Kim et al. |
| 2004/0061672 | A1 * | 4/2004 | Page et al. |

* cited by examiner

*Primary Examiner*—Jean Bruner Jeanglaude

(57) ABSTRACT

A high-speed, high-accuracy DAC has multiple current switches. Each current switch includes a current source that provides a reference current, first and second circuit elements that couple to the current source, and first and second transistors that couple to the first and second circuit elements, respectively. The first transistor provides the reference current to a first output when enabled, and the second transistor provides the reference current to a second output when enabled. The first and second circuit elements provide source degeneration for the first and second transistors, extend the linear operating region for these transistors, and may be implemented with either transistors that are always turned on or resistors. The first and second transistors and the first and second circuit elements may be P-channel field effect transistors (P-FETs), N-channel field effect transistors (N-FETs), or transistors of some other type.

6 Claims, 8 Drawing Sheets

HIGH-SPEED AND HIGH-ACCURACY DIGITAL-TO-ANALOG CONVERTER

BACKGROUND

I. Field

The present invention relates generally to electronic circuits, and more specifically to a digital-to-analog converter (DAC).

II. Background

DACs are widely used for various applications including wireless communication. For example, a wireless device in a wireless communication system typically employs a transmit DAC (TxDAC) to convert one or more digital data streams into one or more analog signals, which are further processed to generate a radio frequency (RF) output signal that is suitable for transmission over a wireless channel. The TxDAC is typically designed to meet stringent dynamic specifications for spurious free dynamic range (SFDR), signal-to-noise ratio (SNR), total harmonic distortion (THD), and so on. These dynamic specifications determine the quality (e.g., spectral purity) of the analog signals from the TxDAC and are normally set such that the RF output signal can meet the overall specifications imposed by the wireless system.

Most conventional TxDACs have insufficient linearity and/or an excessively high noise floor and, by themselves, cannot achieve the dynamic performance required to meet the overall wireless system specifications. As a result, the dynamic specifications for the TxDAC are often relaxed. Additional hardware is then employed after the TxDAC to further condition the analog signals and allow the RF output signal to meet the overall wireless system specifications. However, the additional hardware adds complexity, increases cost, and degrades performance for some parameters, all of which are undesirable for a wireless device.

Newer wireless communication systems often have wider operating bandwidth and support higher data rates. These systems also tend to have more stringent system specifications, which may impose more stringent dynamic requirements on the TxDAC. There is therefore a need in the art for a DAC having good dynamic performance and suitable for use as a TxDAC for wireless communication.

SUMMARY

A high-speed, high-accuracy DAC having good dynamic performance is described herein. The DAC may be used as a TxDAC for wireless communication and also for other applications requiring high speed and/or high accuracy.

In an embodiment, the DAC includes multiple DAC sections, and each DAC section may be implemented with thermometer decoding or binary decoding, both of which are described below. For example, the DAC may include two DAC sections, with each DAC section being implemented with thermometer decoding. In any case, each DAC section includes multiple current switches. Each current switch includes a current source that provides a reference or switching current, first and second circuit elements that couple to the current source, and first and second transistors that couple to the first and second circuit elements, respectively. The first transistor provides the reference current to a first output when enabled, and the second transistor provides the reference current to a second output when enabled. The first and second circuit elements provide source degeneration for the first and second transistors, extend the linear operating region for these transistors, and may be implemented with either transistors that are always turned on or resistors. For example, the first and second transistors and the first and second circuit elements may be P-channel field effect transistors (P-FETs), N-channel field effect transistors (N-FETs), or transistors of some other type.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout and wherein.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

Figure 1:
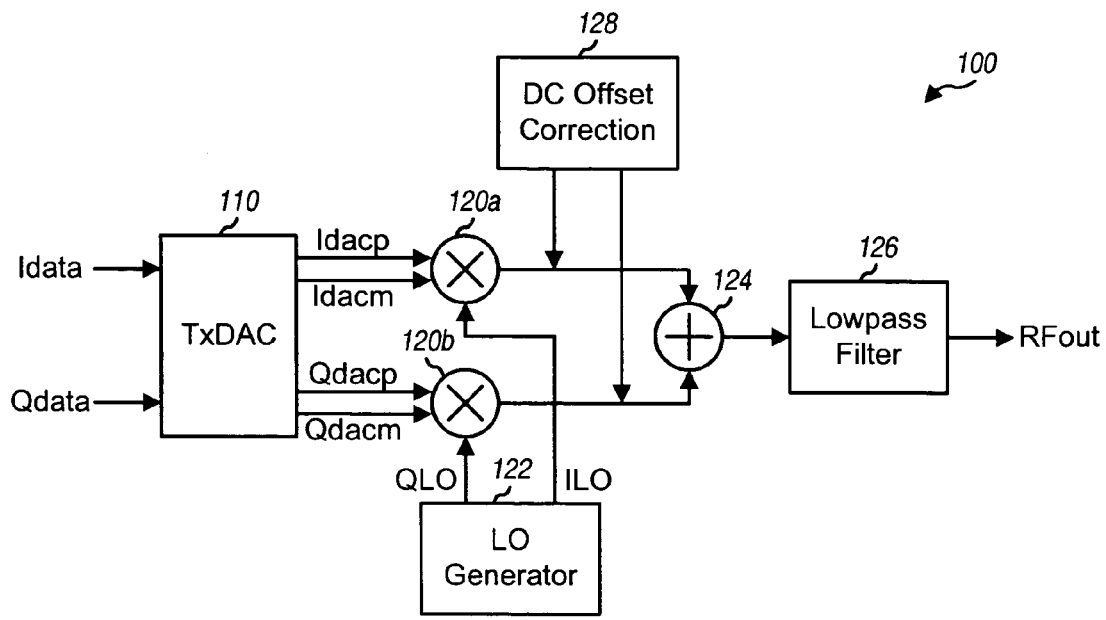
FIG. 1 shows an exemplary transmit path within a wireless device.

FIG. 1 shows a block diagram of an exemplary transmit path 100 within a wireless device. A TxDAC 110 receives an inphase data stream (Idata) and a quadrature data stream (Qdata), converts each data stream to an analog signal, and provides a differential inphase analog signal (Idac) and a differential quadrature analog signal (Qdac) for the Idata and Qdata streams, respectively. The differential Idac signal is composed of a non-inverting Idacp signal and an inverting Idacm signal. The differential Qdac signal is composed of a non-inverting Qdacp signal and an inverting Qdacm signal. A mixer 120a receives the Idac signal and an inphase local oscillator (ILO) signal from an LO generator 122, frequency upconverts the Idac signal with the ILO signal, and provides an inphase modulated component. Similarly, a mixer 120b receives the Qdac signal and a quadrature LO (QLO) signal from LO generator 122, frequency upconverts the Qdac signal with the QLO signal, and provides a quadrature modulated component. A summer 124 receives and sums the inphase and quadrature modulated components and provides a modulated signal. A lowpass filter 126 then filters the modulated signal and provides an RF output signal. Lowpass filter 126 may be implemented with, e.g., a third-order Butterworth $g_m$-C filter. A DC offset correction circuit 128 detects and corrects for DC offset in the inphase and quadrature modulated components. The DC offset, if not corrected, adds a time-varying component in the envelop of the RF output signal and degrades the spectral quality of the RF output signal.

In transmit path 100, lowpass filter 126 and DC offset correction circuit 128 are used to achieve the desired SNR in the frequency band of interest. These circuit blocks are included in transmit path 100 when the dynamic performance of TxDAC 110 is such that the RF output signal cannot meet the overall system specifications. However, these circuit blocks consume power, occupy die area on an integrated circuit (IC), increase cost, and degrade performance for certain parameters such as phase error. For example, a third-order $g_m$-C lowpass filter 126 may occupy 25 to 35% of the total die area for the transmit path.

Figure 2:
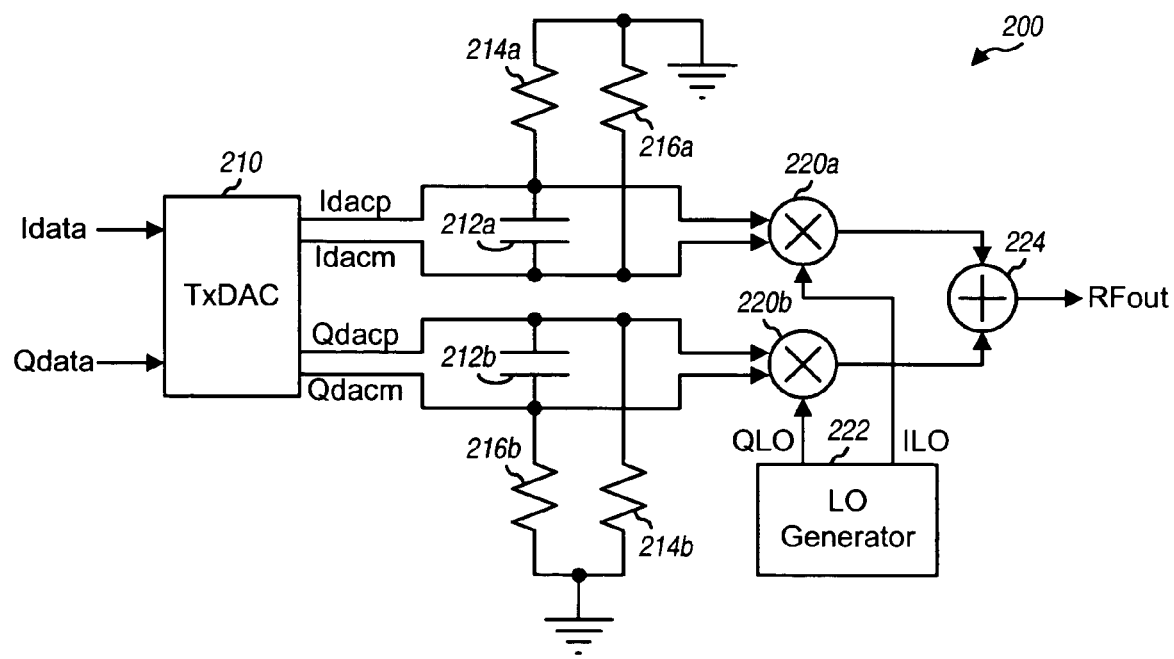
FIG. 2 shows an improved transmit path within a wireless device.

FIG. 2 shows a block diagram of an embodiment of an improved transmit path 200 within a wireless device. A TxDAC 210 receives and converts the Idata and Qdata streams and provides the differential Idac and Qdac signals, respectively. TxDAC 210 has high accuracy and good dynamic performance and may be implemented as described below. Because of the good dynamic performance, simple resistor capacitor (RC) lowpass filters may be used on the transmit path, and the DC offset correction circuit is not needed. For the inphase (I) path, a capacitor 212a couples across the Idacp and Idacm signals, and resistors 214a and 216a couple to the Idacp and Idacm signals, respectively, and circuit ground. For the quadrature (Q) path, a capacitor 212b couples across the Qdacp and Qdacm signals, and resistors 214b and 216b couple to the Qdacp and Qdacm signals, respectively, and circuit ground. Capacitor 212 and resistors 214 and 216 for each path form a differential first-order RC lowpass filter. Resistors 214a, 214b, 216a and 216b are also the load resistors for the TxDAC.

A mixer 220a receives and frequency upconverts the filtered differential Idac signal with an ILO signal from an LO generator 222 and provides an inphase modulated component. Similarly, a mixer 220b receives and frequency upconverts the filtered differential Qdac signal with a QLO signal from LO generator 222 and provides a quadrature modulated component. A summer 224 receives and sums the inphase and quadrature modulated components and provides an RF output signal.

Transmit path 200 utilizes simple RC lowpass filters to achieve the overall system specifications. Consequently, transmit path 200 consumes less power, occupies smaller die area, and has lower cost than transmit path 100 in FIG. 1. All of these benefits are possible because TxDAC 210 has improved dynamic performance (e.g., less distortion and lower noise level) over TxDAC 110 in FIG. 1.

Figure 3:
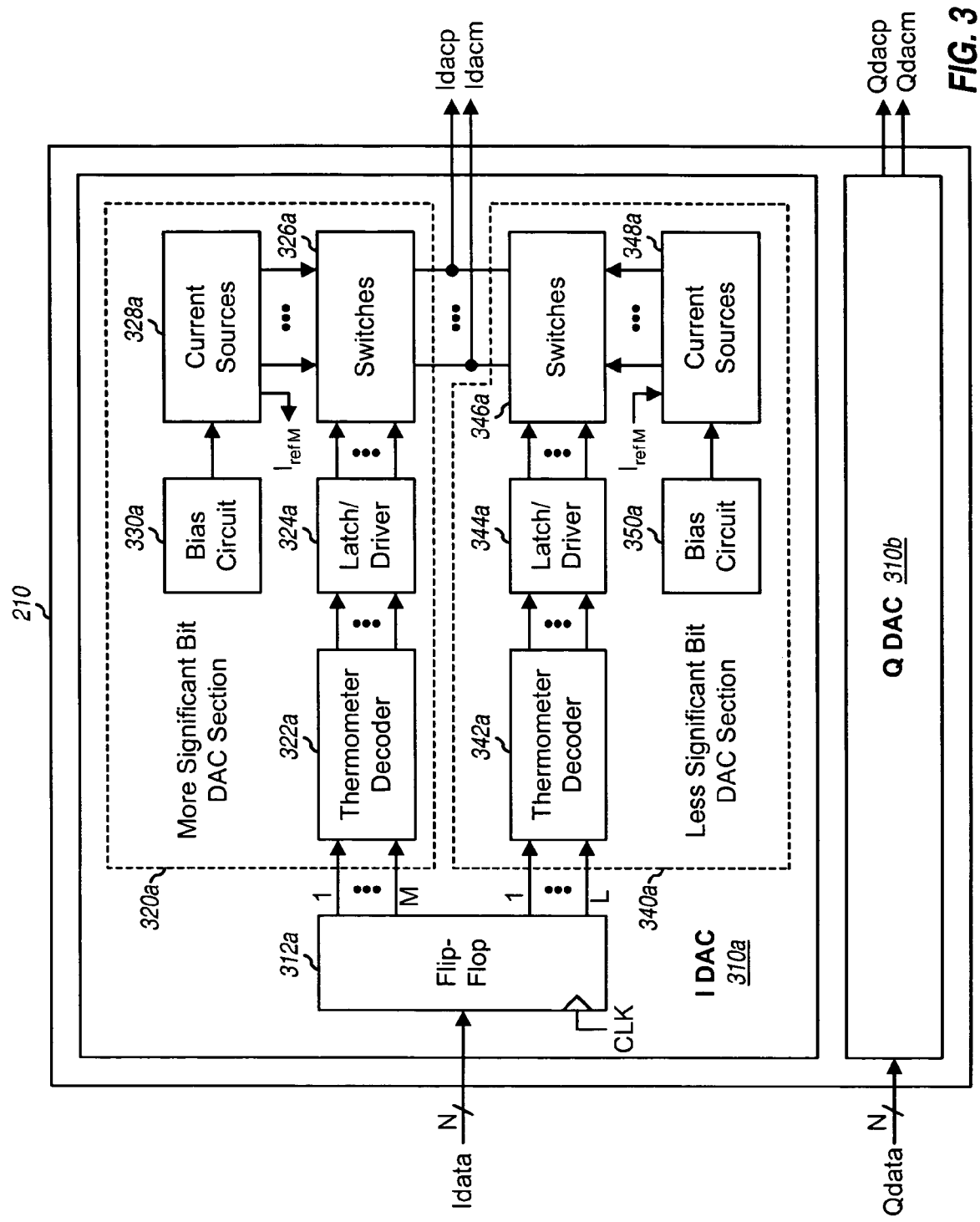
FIG. 3 shows a block diagram of a TxDAC.

FIG. 3 shows a block diagram of an embodiment of TxDAC 210. For this embodiment, TxDAC 210 includes an N-bit DAC 310a for the I path and an N-bit DAC 310b for the Q path, where N may be any integer value (e.g., N=12). In an embodiment, each N-bit DAC 310 is implemented with two thermometer-decoded DAC sections 320 and 340. DAC section 320 covers M more significant bits and DAC section 340 covers L less significant bits, where L and M may be any integer values such that L+M=N (e.g., L=5, M=7, and N=12). For thermometer decoding of M bits, $2^M-1$ circuit elements (e.g., current sources) of equal weight are individually enabled to provide an output value ranging from 0 through $2^M-1$. For binary decoding of M bits, M circuit elements of different weights (e.g., 1, 2, 4, ..., $2^{M-1}$) are individually enabled to provide an output value ranging from 0 through $2^M-1$. A thermometer-decoded DAC can typically provide better performance (e.g., better linearity) than a binary-decoded DAC. In general, each DAC 310 may be implemented with any number of sections, and each section may be thermometer-decoded or binary-decoded.

Within DAC 310a for the I path, a flip-flop 312a receives an N-bit input for the Idata stream, clocks the input data bits with a clock (CLK) to synchronize these bits, provides the M more significant bits to DAC section 320a, and provides the L less significant bits to DAC section 340a. Within DAC section 320a, a thermometer decoder 322a receives the M more significant bits and provides $2^M-1$ digital control signals. A latch/driver 324a receives the $2^M-1$ digital control signals and provides $2^M-1$ corresponding differential input signals for switches 326a. Switches 326a also receive $2^M-1$ reference currents from current sources 328a, and each switch steers its reference current to either the Idacp or Idacm output based on its differential input signal. Latch 324a ensures synchronous switching of the reference currents in order to reduce glitch energy in the Idacp and Idacm signals. A bias circuit 330a generates a bias voltage for current sources 328a.

Within DAC section 340a, a thermometer decoder 342a receives the L less significant bits and provides $2^L-1$ digital control signals. A latch/driver 344a receives the $2^L-1$ digital control signals and provides $2^L-1$ corresponding differential input signals for switches 346a. Switches 346a also receive $2^L-1$ reference currents from current sources 348a and steer the reference currents to the appropriate Idacp and Idacm outputs based on the $2^L-1$ differential input signals. A bias circuit 350a generates a bias voltage for current sources 348a.

DAC 310b for the Q path may be implemented in the same manner as DAC 310a for the I path.

Figure 4:
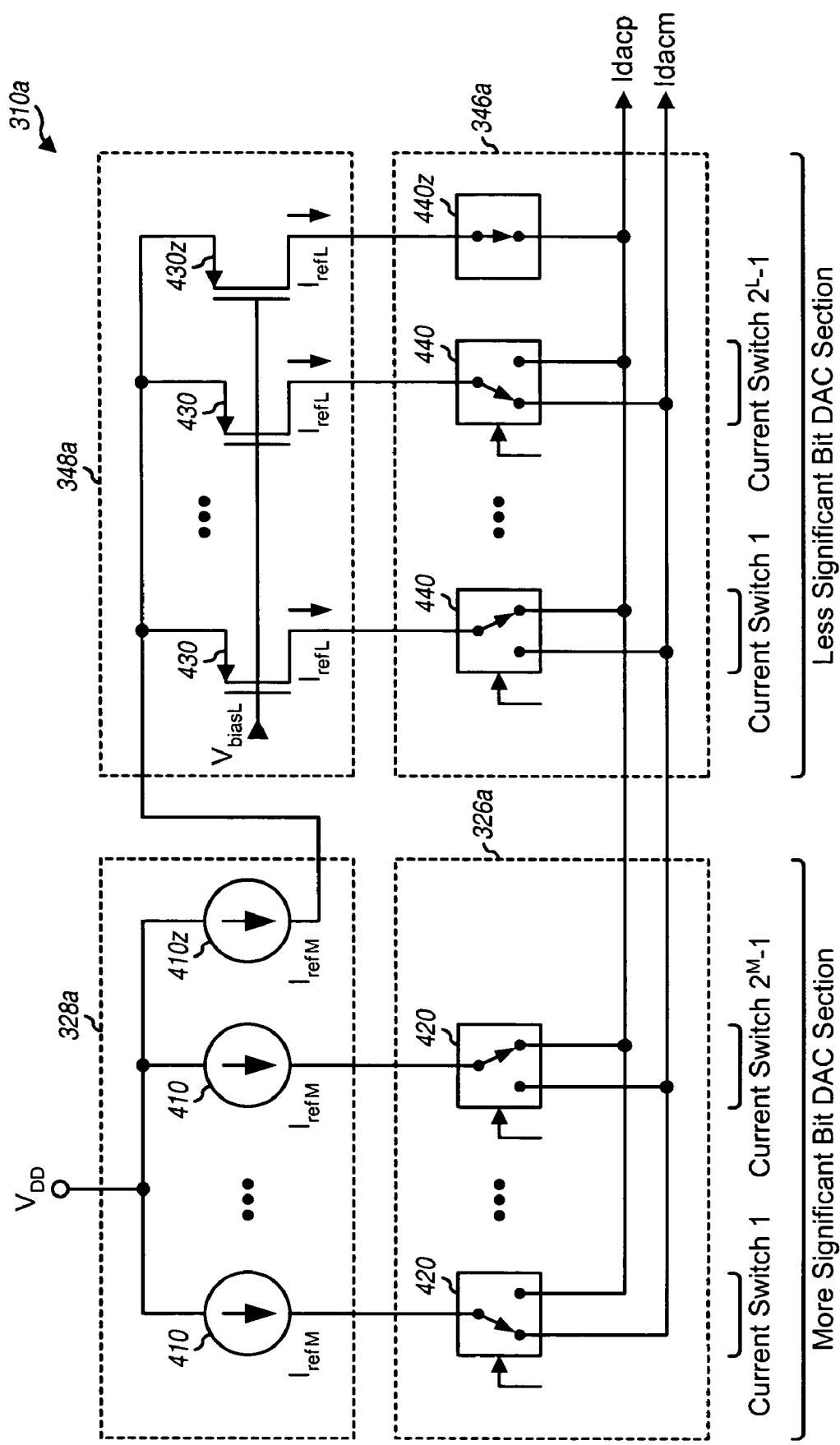
FIG. 4 shows a DAC for an inphase path.

FIG. 4 shows a schematic diagram of a portion of DAC 310a for the I path. Block 328a within DAC 310a includes $2^M$ current sources 410, with each current source 410 providing a reference current of $I_{refM}$. Current sources 410 may be implemented using current mirrors or some other circuit design known in the art. Although not shown in FIG. 3 for clarity, the $2^M$ current sources 410 receive a bias voltage ($V_{biasM}$) from bias circuit 330a. Block 326a includes $2^M-1$ switches 420. Each switch 420 is coupled to a respective current source 410 and further receives a respective differential input signal from latch/driver 324a. Each switch 420 steers the reference current $I_{refM}$ from the associated current source 410 to either the Idacp or Idacm output based on its differential input signal.

Block 348a includes $2^L$ P-FETs 430 coupled in parallel. The sources of all P-FETs 430 couple together and receive the reference current $I_{refM}$ from current source 410z in block 328a. The gates of all P-FETs 430 couple together and receive the bias voltage ($V_{biasL}$) from bias circuit 350a. The $2^L$ P-FETs 430 have the same width and length dimensions, and each P-FET provides a reference current of $I_{refL}=I_{refM}/2^L$. Block 346a includes $2^L-1$ switches 440. Each switch 440 is coupled to the drain of a respective P-FET 430 and further receives a respective differential input signal from latch/driver 344a. Each switch 440 steers the reference current $I_{refL}$ from the associated P-FET 430 to either the Idacp or Idacm output based on its differential input signal. The last P-FET 430z provides its reference current via a switch 440z to the Idacp output. In general, the current for P-FET 430z may be steered to Idacp or Idacm. P-FET 430z and switch 440z form a dummy current switch that is designed to match as closely as possible to the other $2^L-1$ current switches in the less significant bit DAC section. The dummy current switch provides good matching and improves performance. The Idacp and Idacm outputs are typically coupled to two output resistors (e.g., resistors 214a and 216a in FIG. 2) to generate Vdacp and Vdacm output voltages, respectively.

Figure 5:
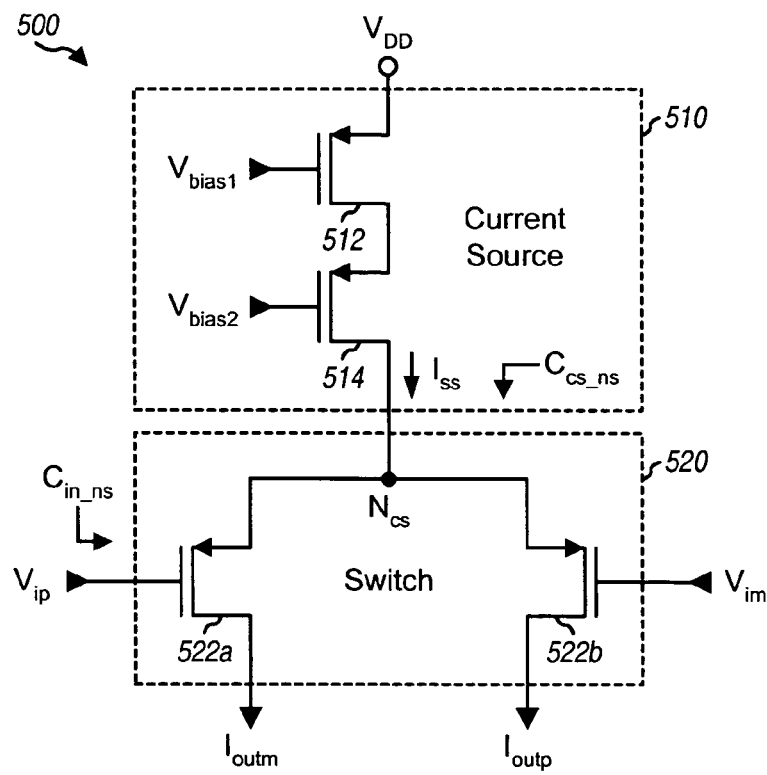
FIG. 5 shows a current switch.

FIG. 5 shows a schematic diagram of a current switch 500 that includes a current source 510 and a switch 520. Current switch 500 may be used for each of the $2^M-1$ current switches in the more significant bit DAC section in FIG. 4. In this case, switch 520 corresponds to one switch 420, and current source 510 corresponds to one current source 410. Current switch 500 may also be used for each of the $2^L-1$ current switches in the less significant bit DAC section in FIG. 4. In this case, switch 520 corresponds to one switch 440, and current source 510 corresponds to one P-FET 430 (and also current source 410z that provides the reference current $I_{refM}$).

Current source 510 includes two P-FETs 512 and 514 coupled in series. P-FET 512 has its source coupled to a power supply ($V_{DD}$), its gate receiving a first bias voltage ($V_{bias1}$), and its drain coupled to the source of P-FET 514. P-FET 514 has its gate receiving a second bias voltage ($V_{bias2}$) and its drain providing a switching current of $I_{SS}$. The $V_{bias1}$ and $V_{bias2}$ voltages may correspond to the bias voltages for current sources 410 and P-FETs 430, respectively, in FIG. 4. The switching current may correspond to the reference current $I_{refM}$ from one current source 410 in FIG. 4 or to the reference current $I_{refL}$ from one P-FET 430.

Switch 520 includes two "switching" P-FETs 522a and 522b coupled as a differential pair. The sources of P-FETs 522a and 522b are coupled together and further to the drain of P-FET 514. P-FET 522a has its gate receiving a non-inverting input signal ($V_{ip}$) and its drain providing an inverting output current ($I_{outm}$). P-FET 522b has its gate receiving an inverting input signal ($V_{im}$) and its drain providing a non-inverting output current ($I_{outp}$). The drains of P-FETs 522a and 522b couple to the Idacm and Idacp outputs, respectively. P-FETs 522a and 522b are operated as a switch. The differential input voltage ($V_{in}=V_{ip}-V_{im}$) enables one of the switching P-FETs and disables the other switching P-FET. The enabled P-FET steers the switching current to its drain output.

At high switching frequencies, the dynamic performance of a DAC is mainly determined by the settling characteristics of the current switches. For an ideal current switch, the switching P-FETs turn on and off instantaneously, and the enabled P-FET provides an ideal step response for the output current. For a practical current switch, the switching P-FETs transition between the on and off states over some finite time interval, and the enabled P-FET provides a non-ideal response for the output current. This non-ideal response may include a slewing period, a glitch impulse, residual clock and digital data feed-through, and so on. All of these artifacts result in dynamic nonlinearities that degrade the dynamic performance of the DAC.

Figure 6:
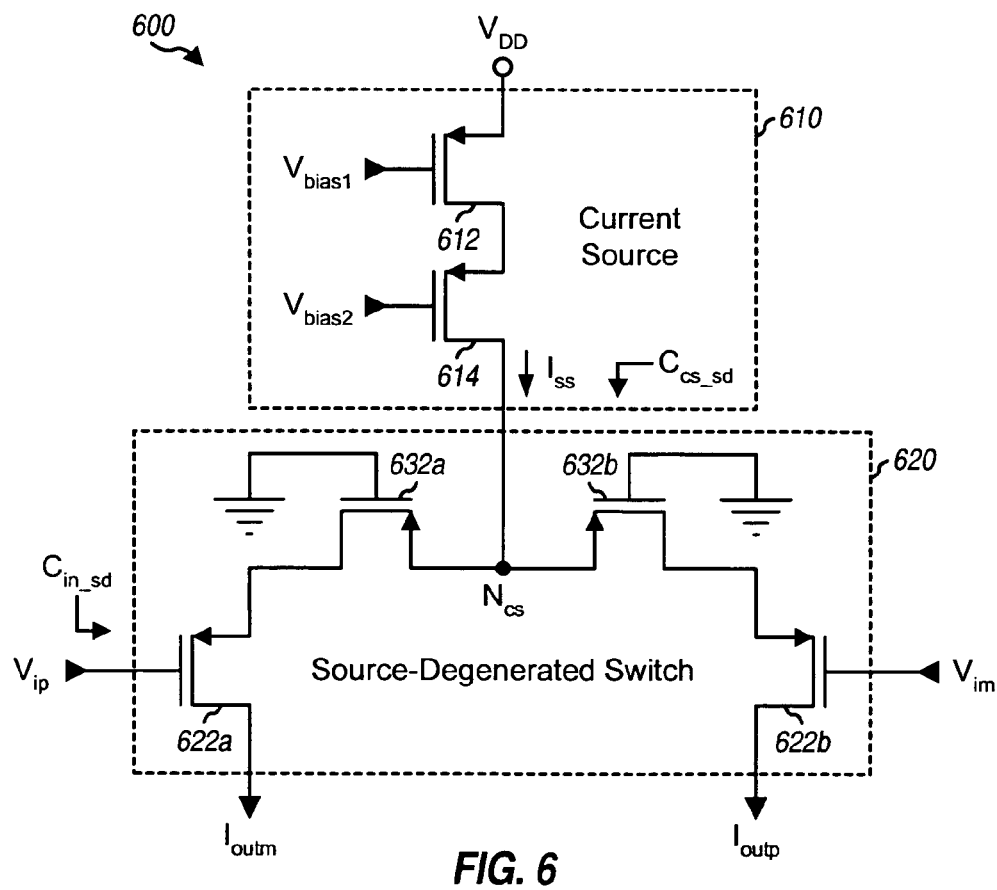
FIG. 6 shows a P-FET degenerated current switch.

FIG. 6 shows a schematic diagram of a degenerated current switch 600, which has improved switching characteristics over current switch 500 in FIG. 5. Current switch 600 includes a current source 610 and a source-degenerated switch 620. Current switch 600 may be used for each of the $2^M-1$ current switches in the more significant bit DAC section in FIG. 4 and also for each of the $2^M-1$ current switches in the less significant bit DAC section. Current source 610 includes two P-FETs 612 and 614 coupled in series as described above for current source 510 in FIG. 5.

Switch 620 includes two switching P-FETs 622a and 622b and two "degeneration" P-FETs 632a and 632b. P-FETs 622a and 632a are coupled in series, and P-FETs 622b and 632b are also coupled in series. P-FET 622a has its gate receiving the $V_{ip}$ signal, its drain providing the $I_{outm}$ current, and its source coupled to the drain of P-FET 632a. P-FET 632a has its gate coupled to circuit ground and its source coupled to the drain of P-FET 614. Similarly, P-FET 622b has its gate receiving the $V_{im}$ signal, its drain providing the $I_{outp}$ current, and its source coupled to the drain of P-FET 632b. P-FET 632b has its gate coupled to circuit ground and its source coupled to the drain of P-FET 614. P-FETs 622a and 632a and P-FETs 622b and 632b form a differential pair with source degeneration. P-FETs 632a and 632b are always turned on and provide the source degeneration for the differential pair. The $V_{in}$ differential input voltage enables one of the switching P-FETs and disables the other switching P-FET. The enabled P-FET steers the switching current to its drain output.

Figure 7:
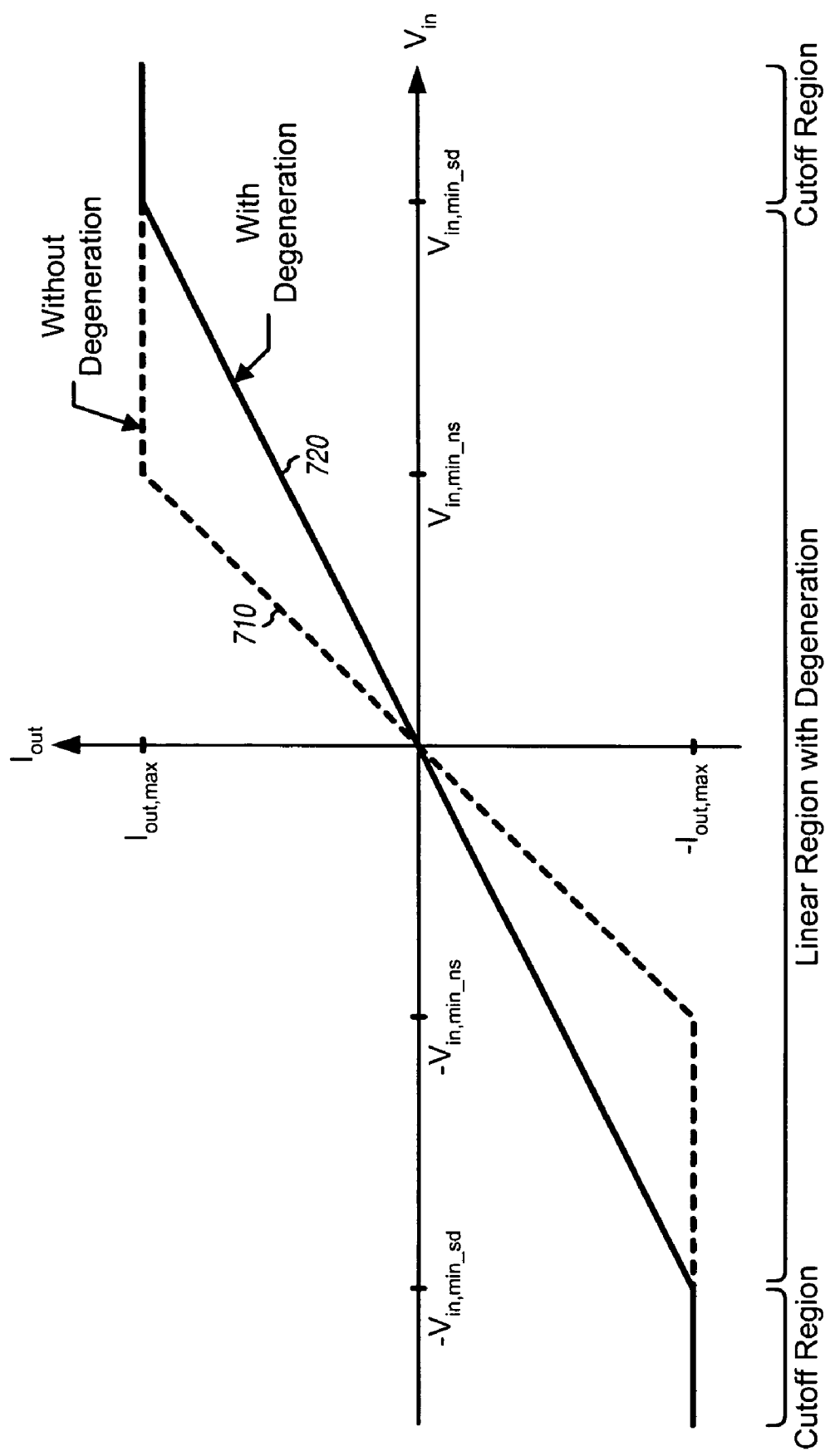
FIG. 7 shows transfer functions for the current switches in FIGS. 5 and 6.

FIG. 7 shows transfer functions for switch 520 in FIG. 5 and degenerated switch 620 in FIG. 6. The input voltage for each switch is $V_{in}$ and the output current for each switch is $I_{out}=I_{outp}-I_{outm}$. $V_{in}$ and $I_{out}$ can take on positive and negative values. Plot 710 shows a simplified output current to input voltage (I–V) transfer function for switch 520. The output current for switch 520 (1) varies linearly with input voltage for $V_{in}$ within a linear range of $-V_{in,min-ns}$ to $V_{in,min-ns}$ and (1) saturates at $\pm I_{out,max}$ for $V_{in}$ outside of this linear range. The subscript "ns" denotes no source degeneration. Plot 720 shows a simplified I–V transfer function for degenerated switch 620. The output current for switch 620 (1) varies linearly with input voltage for $V_{in}$ within a linear range of $-V_{in,min-sd}$ to $V_{in,min-sd}$ and (2) saturates at $\pm I_{out,max}$ for $V_{in}$ outside of this liner range. The subscript "sd" denotes source degeneration.

Without source degeneration, the minimum switching voltage, $V_{in,min-ns}$, for each switching P-FET 522 in switch 520 may be expressed as:

$$V_{in,\min\_ns} = \sqrt{\frac{2 \cdot I_{ss}}{\mu_p \cdot C_{ox} \cdot W/L}}, \qquad \text{Eq (1)}$$

where $\mu_p$ is the hole mobility for the switching P-FET;

$C_{ox}$ is the gate-to-oxide capacitance of the switching P-FET; and

W and L are the width and length, respectively, of the switching P-FET.

With source degeneration, the minimum switching voltage, $V_{in,min-sd}$, for each switching P-FET 622 in switch 620 may be expressed as:

$$V_{in,\min\_sd} = \sqrt{\frac{2 \cdot I_{ss}}{\mu_p \cdot C_{ox} \cdot W/L}} \times (1 + g_m \cdot r_{on\_d}), \qquad \text{Eq (2)}$$

where $g_m$ is the transconductance of the switching P-FET; and $r_{on-d}$ is the drain-to-source (or "on") resistance of the degeneration P-FET.

The transconductance $g_m$ at an equilibrium state, with $V_{in}=0$, may be expressed as:

$$g_m = \sqrt{I_{ss} \cdot \mu_p \cdot C_{ox} \cdot W/L}. \qquad \text{Eq (3)}$$

The on resistance $r_{on\_d}$ of each degeneration P-FET may be expressed as:

$$r_{on\_d} = \frac{1}{\mu_p \cdot C_{ox} \cdot (W_d/L_d) \cdot (V_{gs\_d} - V_{th\_d})},$$ Eq (4)

where $W_d$ and $L_d$ are respectively the width and length of the degeneration P-FET;

$V_{gs\_d}$ is the gate-to-source voltage for the degeneration P-FET; and $V_{th\_d}$ is a threshold voltage for the degeneration P-FET.

Since the quantity $g_m \cdot r_{on\_d}$ is a positive value, equations (1) and (2) indicate that the minimum switching voltage for P-FETs 622a and 622b in degenerated switch 620 is greater than the minimum switching voltage for P-FETs 522a and 522b in switch 520, or $V_{in,min\_sd} > V_{in,min\_ns}$. This characteristic is shown by plots 710 and 720 in FIG. 7.

Each switch operates in a saturation region when the input voltage is within the linear range (i.e., when $|V_{in}| \leq V_{in,min}$) and in a triode region when the input voltage is outside of the linear range (i.e., when $|V_{in}| > V_{in,min}$). In the saturation region, the contribution of slewing behavior to the overall settling time is negligible. In the triode region, the contribution of slewing behavior to the overall settling time increases significantly due to overshoot and ringing, as described below.

Figure 8A:
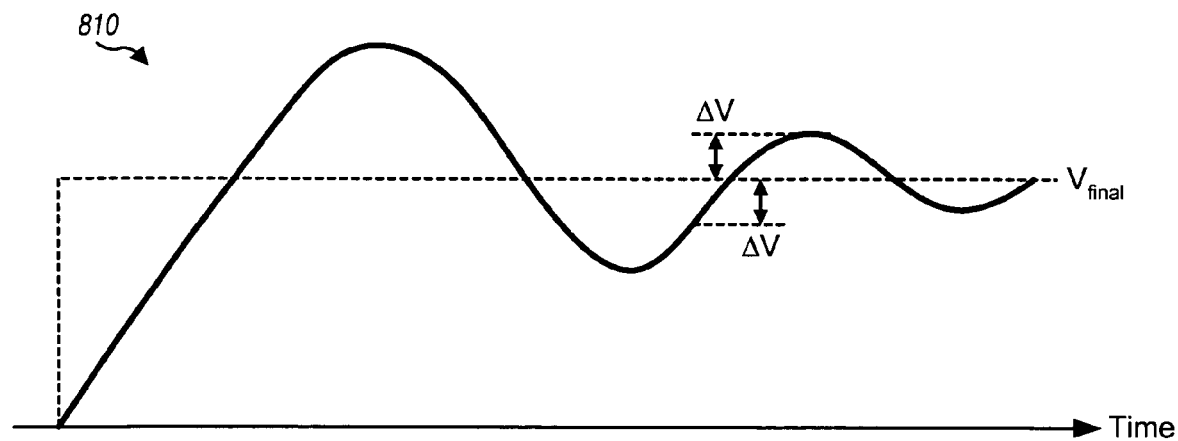
FIGS. 8A through 8C show three output waveforms for a current switch.

FIG. 8A shows an exemplary output waveform 810 for a switching P-FET that is overdriven with a step change in input voltage. The switching P-FET is overdriven if the input voltage is much greater than the minimum switching voltage, e.g., if $V_{in} \approx 1.3$ V and $V_{in,min\_ns} \approx 200$ mV. Overdriving the switching P-FET typically causes overshoot and ringing in the output current, both of which increase the settling time and may also cause other deleterious effects in the output waveform. The DAC output is considered to be settled if the output voltage falls within $\pm \Delta V$ of the final value. $\Delta V$ may be selected, e.g., as $\Delta V = V_{LSB}/2$, where $V_{LSB}$ is the change in output voltage for the least significant bit of the DAC.

Figure 8B:
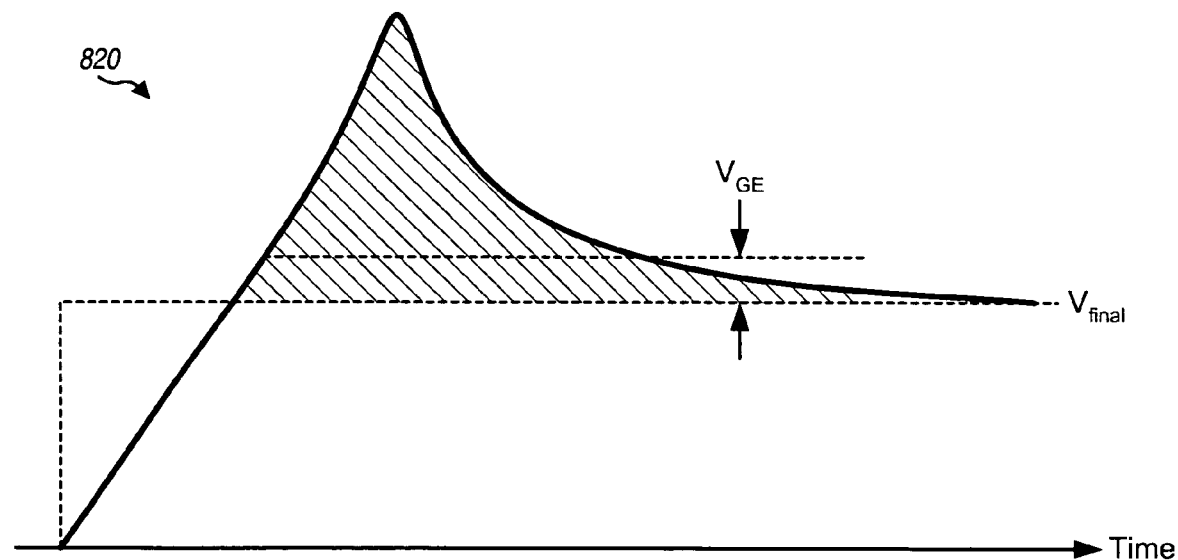

FIG. 8B shows another exemplary output waveform 820 for a switching P-FET with a step change in input voltage. Waveform 820 has a large glitch that may be due to various factors, as described below. A subsequent lowpass filter would filter out the glitch. However, the glitch energy (which is represented by hashing in FIG. 8B) is spread across most of the switching period (T) and results in an error in the output voltage level. The voltage level change, $V_{GE}$, from the correct output voltage may be expressed as:

$$V_{GE} \approx \frac{\text{glitch energy}}{T}.$$ Eq (5)

Figure 8C:
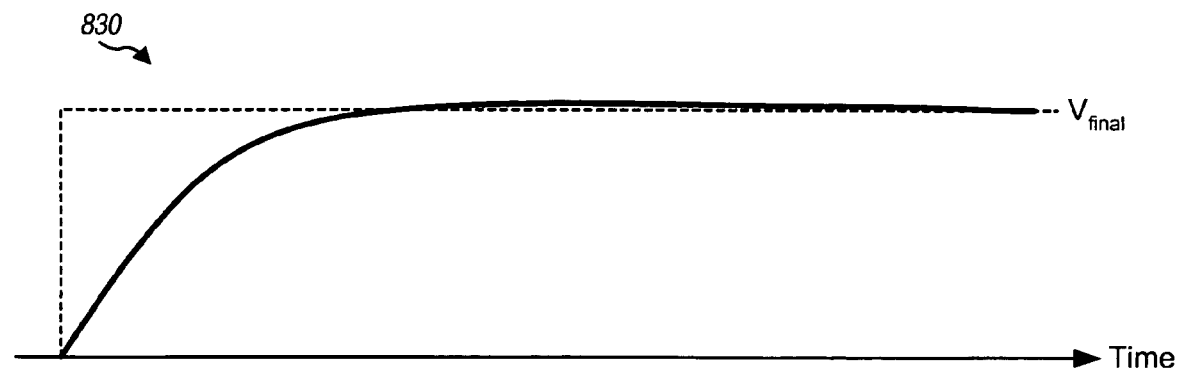

FIG. 8C shows yet another exemplary output waveform 830 for a switching P-FET with a step change in input voltage. Waveform 830 has little or no overshoot and ringing and thus settles to the final value in a shorter amount of time than waveforms 810 and 820. Furthermore, waveform 830 has little or no glitch energy, a small or zero voltage level change, and thus greater accuracy than waveform 820.

A smaller $V_{th}$ for a switching P-FET generally results in a faster slew rate but more overshoot, which extends the settling time (e.g., as shown in FIGS. 8A and 8B). A larger $V_{th}$ for a switching P-FET generally results in a slower slew rate but less overshoot, which typically shortens the settling time (e.g., as shown in FIG. 8C). The output tracks by the fast settling behavior in the case of $|V_{in}| \leq V_{in,min}$ and tracks by the slow slewing behavior in the case of $|V_{in}| > V_{in,min}$. For a larger $V_{th}$, the output waveform is dependent more on the settling behavior of the switching P-FET than the slewing behavior. Switching performance thus generally improves with a larger $V_{th}$.

Besides extending the linear range for the switching P-FETs, source degeneration also mitigates the effects of parasitic capacitances within the switch. Each switching P-FET has a gate-to-drain capacitance $C_{gd}$. Referring back to FIG. 5, in the linear region, the input capacitance $C_{in\_ns}$ looking into the gate of each switching P-FET 522, without source degeneration, may be expressed as:

$$C_{in\_ns} = C_{gd} \cdot g_m \cdot r_{load},$$ Eq (6)

where $r_{load}$ is the load impedance for the switching P-FET. The gain $g_m \cdot r_{load}$ is due to Miller effect.

Referring to FIG. 6, the input capacitance $C_{in\_sd}$ looking into the gate of each switching P-FET 622, with source degeneration, may be expressed as:

$$C_{in\_sd} = \frac{C_{gd} \cdot g_m \cdot r_{load}}{1 + g_m \cdot r_{on\_d}}.$$ Eq (7)

Equations (6) and (7) indicate that the input capacitance is reduced with source degeneration. The smaller input capacitance allows the DAC to be clocked at a higher rate. The smaller input capacitance also reduces the amount of clock and digital feed-through from the $V_{in}$ signal to the DAC output. Both of these benefits are desirable for a high-speed and high-accuracy DAC.

The parasitic capacitance seen by the current source looking into the switch is also reduced with source degeneration. Referring to FIG. 5, without source degeneration, the $C_{cs\_ns}$ capacitance seen by current source 510 is dominated by the source-to-bulk capacitance $(C_{sb})$ and the gate-to-source capacitance $(C_{gs})$ of switching P-FETs 522a and 522b. Referring to FIG. 6, with source degeneration, the $C_{cs\_sd}$ capacitance seen by current source 610 is dominated by the $C_{sb}$ capacitance of degeneration P-FETs 632a and 632b, which is typically only a fraction of the $C_{sb}$ and $C_{gs}$ capacitances of switching P-FETs 622a and 622b.

Source degeneration can reduce glitch energy and provide an output waveform having better fidelity. Glitches and glitch energy in the output waveform can come from various sources. First, glitches may be caused by different switching delays across all of the $2^M + 2^L - 1$ current switches in the DAC. Glitches can occur when the current switches in the DAC turn on and off at slightly different time instants, so that some current switches are left on slightly longer than required. Second, glitches may be caused by both switching P-FETs in a given current switch being turned off momentarily, which causes the DAC output to be pulled up toward $V_{DD}$. Third, glitch energy is dependent on the peak glitch pulses at node $N_{cs}$ and the rate at which the glitches can be discharged.

Source degeneration can reduce glitch energy due to the three phenomena described above. First, the smaller input capacitance with source degeneration reduces switching delay for each current switch. This results in less variation in switching delays across all of the $2^M + 2^L - 1$ current switches in the DAC, which in turn reduces the magnitude of the glitches. Second, the on resistance of the degeneration P-FETs prevents the DAC output from being pulled up too high toward $V_{DD}$, if and when the switching P-FETs are both momentarily turned off. A voltage drop is formed across each degeneration P-FET during the switching phase. This voltage drop absorbs part of the glitch and further prevents the switching P-FETs from going into a deep off state during the switching period. Third, glitches are discharged at a faster rate with source degeneration because of the smaller $C_{cs-sd}$ capacitance at node $N_{cs}$.

Source degeneration for the switches in the DAC can thus provide various benefits. Source degeneration increases the minimum switching voltage, $V_{in,min}$, shortens settling time, reduces glitch energy, and improves the dynamic performance of the DAC. The shortened settling time allows for higher DAC switching speed, and the combination of shortened settling time and reduced glitch energy improves the accuracy of the output waveform from the DAC.

FIGS. 4 through 6 show exemplary designs of the current switches using P-FETs. The current switches may also be implemented with N-FETs or a combination of both P-FETs and N-FETs.

Figure 9:
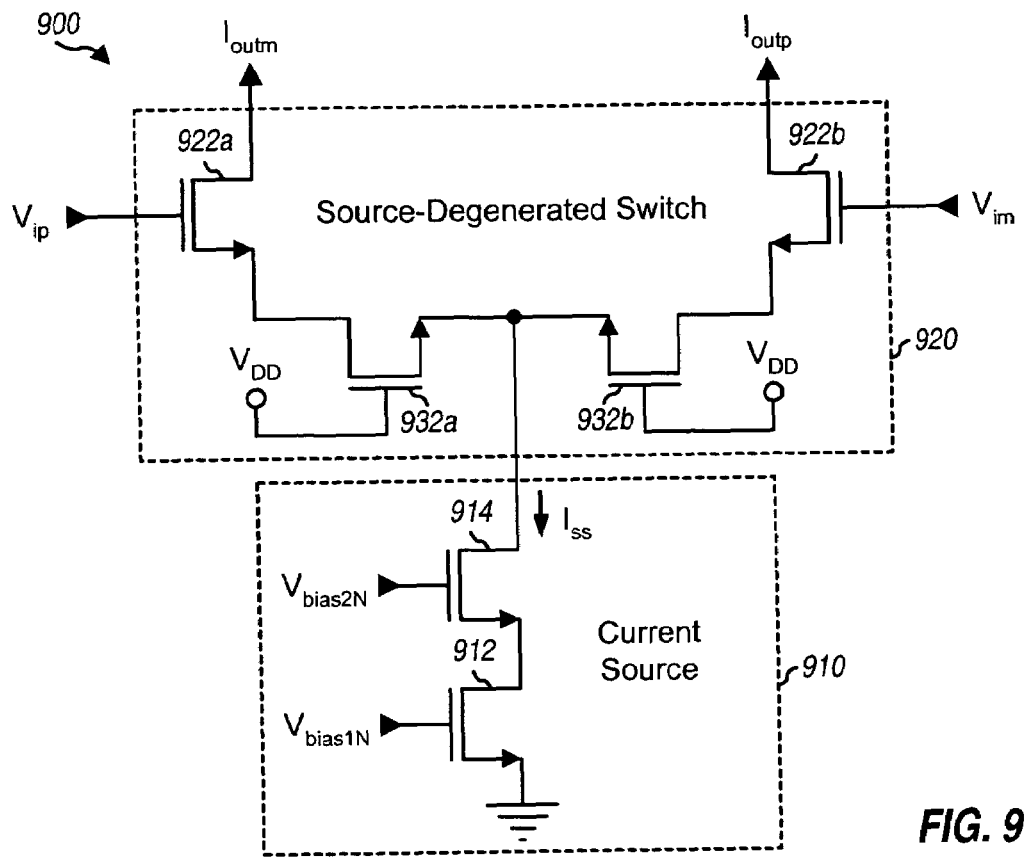
FIG. 9 shows an N-FET degenerated current switch.

FIG. 9 shows a schematic diagram of a degenerated current switch 900, which is implemented with N-FETs. Current switch 900 includes a current source 910 and a degenerated switch 920. Current source 910 includes two N-FETs 912 and 914 coupled in series and receiving bias voltages $V_{bias1N}$ and $V_{bias2N}$, respectively.

Switch 920 includes two switching N-FETs 922a and 922b and two degeneration N-FETs 932a and 932b. N-FETs 922a and 932a are coupled in series, and N-FETs 922b and 932b are also coupled in series. N-FET 922a has its gate receiving the $V_{ip}$ signal, its drain providing the $I_{outm}$ current, and its source coupled to the drain of N-FET 932a. N-FET 932a has its gate coupled to $V_{DD}$ and its source coupled to the drain of N-FET 914. Similarly, N-FET 922b has its gate receiving the $V_{im}$ signal, its drain providing the $I_{outp}$ current, and its source coupled to the drain of N-FET 932b. N-FET 932b has its gate coupled to $V_{DD}$ and its source coupled to the drain of N-FET 914. N-FETs 922a and 932a and N-FETs 922b and 932b are also coupled as a differential pair with source degeneration. N-FETs 932a and 932b are always turned on and provide the source degeneration for the differential pair.

Figure 10:
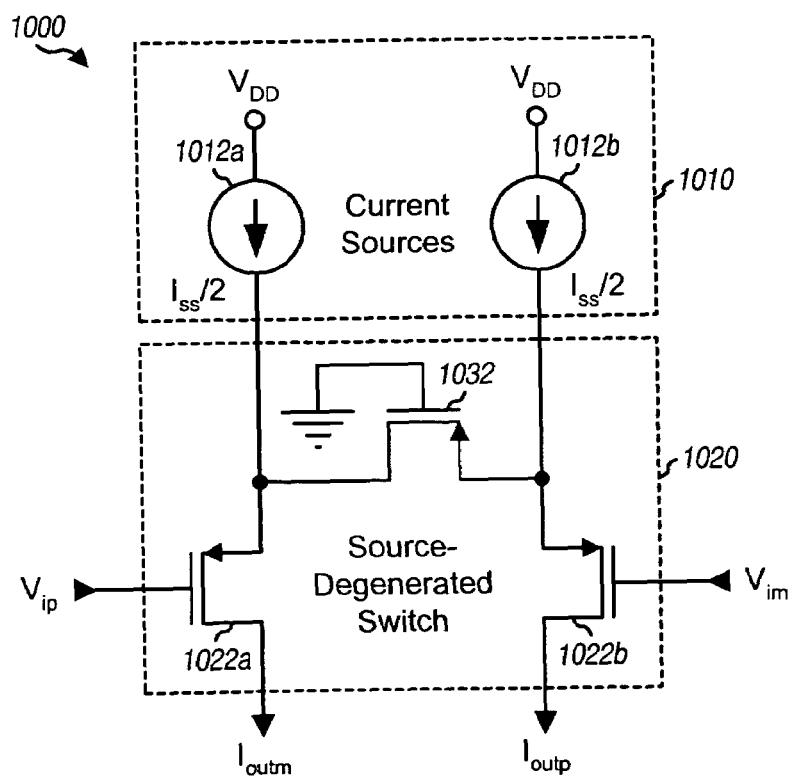
FIG. 10 shows another P-FET degenerated current switch.

FIG. 10 shows a schematic diagram of another degenerated current switch 1000 implemented with P-FETs. Current switch 1000 includes current sources 1012a and 1012b and a degenerated switch 1020. Switch 1020 includes two switching P-FETs 1022a and 1022b and a degeneration P-FET 1032. P-FET 1022a has its gate receiving the $V_{ip}$ signal, its drain providing the $I_{outm}$ current, and its source coupled to current source 1012a and to the drain of P-FET 1032. P-FET 1022b has its gate receiving the $V_{im}$ signal, its drain providing the $I_{outp}$ current, and its source coupled to current source 1012b and to the source of P-FET 1032. P-FET 1032 has its gate coupled to circuit ground, is always turned on, and provides the source degeneration for P-FETs 1022a and 1022b.

Figure 11:
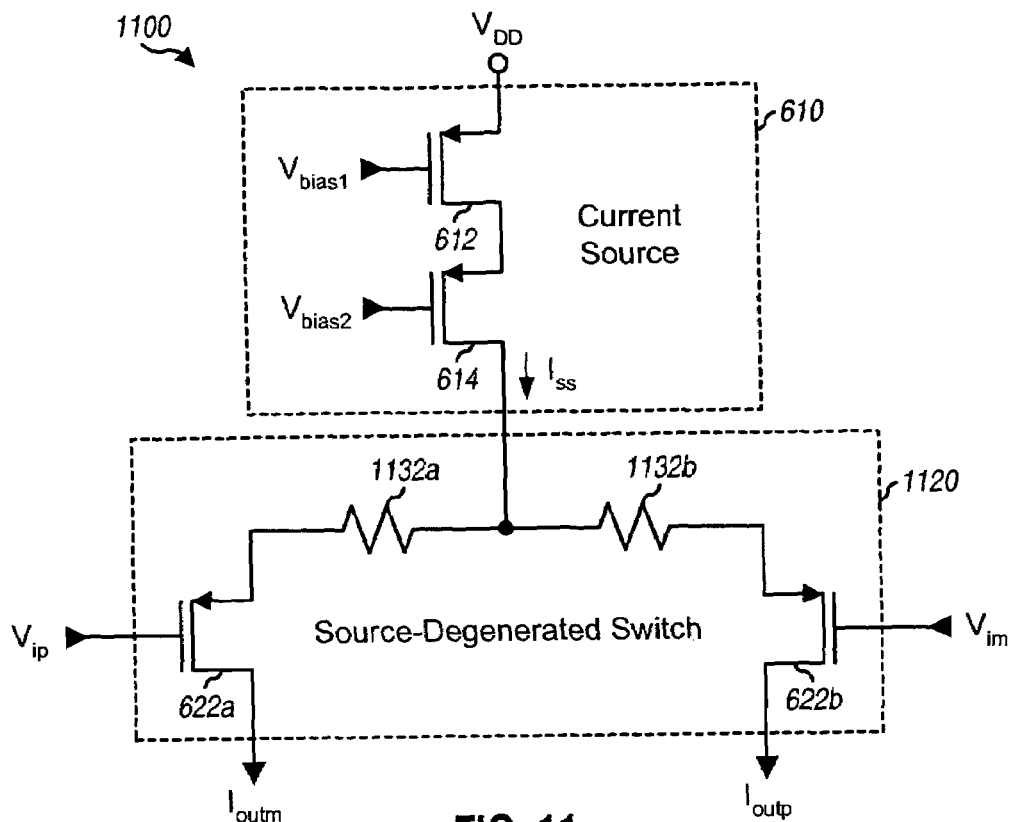
FIG. 11 shows a P-FET current switch with resistive degeneration.

FIG. 11 shows a schematic diagram of a P-FET degenerated current switch 1100 with resistive degeneration. Current switch 1100 includes all of the circuit elements of degenerated current switch 600 in FIG. 6, except that degeneration P-FETs 632a and 632b are replaced with resistors 1132a and 1132b, respectively.

Figure 12:
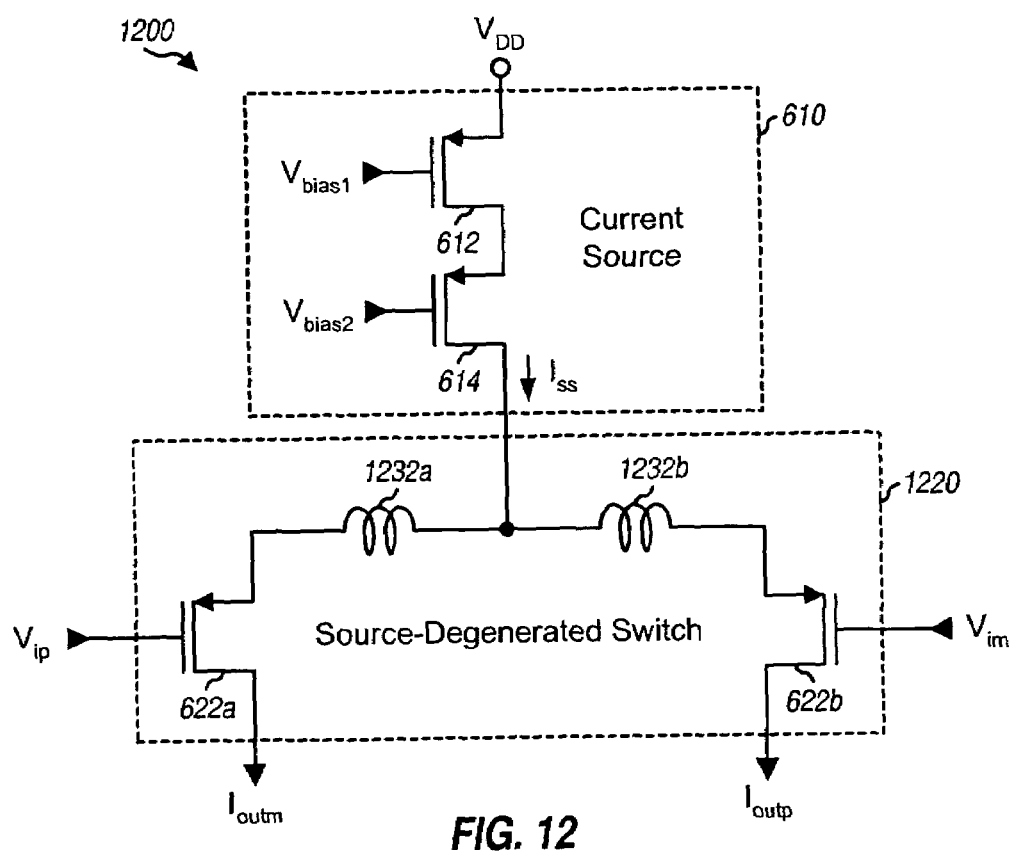
FIG. 12 shows a P-FET current switch with inductive degeneration.

FIG. 12 shows a schematic diagram of a P-FET degenerated current switch 1200 with inductive degeneration. Current switch 1200 includes all of the circuit elements of degenerated current switch 600 in FIG. 6, except that degeneration P-FETs 632a and 632b are replaced with inductors 1232a and 1232b, respectively.

In general, the source degeneration may be achieved with P-FETs (e.g., as shown in FIGS. 6 and 10), N-FETs (e.g., as shown in FIG. 9), P-FETs and N-FETs (e.g., coupled in parallel), resistors (e.g., as shown in FIG. 11), inductors (e.g., as shown in FIG. 12), or some other circuit elements. The switching and degeneration FETs are typically of the same type, either P-FETs or N-FETs, so that they may be more compactly laid out on an IC die. FETs can typically be implemented with smaller die area than resistors.

The on resistance of the FETs used for source degeneration may be selected to achieve the desired switching performance for the DAC. A larger on resistance can extend the linear operating range, which may improve the switching characteristics of the current switch. However, an on resistance that is too large may increase the $V_{cs}$ voltage at node $N_{cs}$ too high. This high $V_{cs}$ voltage may cause the FETs within the current source to operate in a triode region instead of a saturation region, which is typically undesirable.

The current switches and DAC described herein may be implemented in P-channel metal oxide semiconductor (P-MOS), N-channel MOS (N-MOS), complementary metal oxide semiconductor (CMOS), bipolar-CMOS (Bi-CMOS), gallium arsenide (GaAs), or some other IC process technology. For example, the current switches and DAC may be implemented with P-FETs, N-FETs, bipolar junction transistors (BJTs), GaAs transistors, hetero-junction bipolar transistors (HBTs), high electron mobility transistors (HEMTs), and so on. The DAC may also be fabricated on various types of IC such as digital ICs, mixed signal ICs, and RF ICs (RFICs).

The high-speed and high-accuracy DAC described herein may be used for a TxDAC, a video DAC, an instrumentation DAC, and so on. The TxDAC may be used for wireless and wireline communication. For example, the TxDAC may be used for wireless devices as well as base stations in a Code Division Multiple Access (CDMA) system, a Wideband-CDMA (W-CDMA) system, a Time Division Multiple Access (TDMA) system, a Global System for Mobile Communications (GSM) system, an Advanced Mobile Phone System (AMPS) system, and so on. These various systems are well known in the art. A GSM system may implement Enhanced Data rates for Global Evolution (EDGE), which supports higher data rates than second generation GSM.

The DAC described herein may be operated at a higher switching frequency because of the lower parasitic capacitance and faster settling time. For example, the DAC may be operated at a switching rate of 50 MHz or higher for GSM and EDGE and at a switching rate of 100 MHz or higher for CDMA and W-CDMA. A higher switching rate may simplify the filtering of the DAC output. A higher switching rate may also avoid a scenario wherein the clock image falls within a pre-assigned frequency band and distorts the signal in this frequency band.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus comprising:
a digital-to-analog converter (DAC) comprising a plurality of current switches, each current switch comprising:
a current source operable to provide a reference current,
first and second circuit elements coupled to the current source;
first and second transistors coupled to the first and second circuit elements, respectively, the first transistor operable to provide the reference current to a first output when enabled, the second transistor operable to provide the reference current to a second output when enabled, and the first and second circuit elements providing source degeneration for the first and second transistors; and
a lowpass filter coupled to the DAC and operable to filter the first and second outputs from the first and second transistors in the plurality of current switches for the DAC.

2. The apparatus of claim 1, wherein the lowpass filter is a resistor capacitor (RC) lowpass filter.

3. The apparatus of claim 1, wherein the first and second circuit elements for each current switch are third and fourth transistors.

4. The apparatus of claim 3, wherein the first, second, third, and fourth transistors in each current switch are each a P-channel field effect transistor (P-FET) or an N-channel field effect transistor (P-FET).

5. A wireless device in a wireless communication system, comprising:
first and second digital-to-analog converters (DACs), the first DAC operable to receive and convert a first data stream to a first analog signal, and the second DAC operable to receive and convert a second data stream to a second analog signal, each of the first and second DACs comprising a plurality of current switches, each current switch comprising
a current source operable to provide a reference current,
first and second circuit elements coupled to the current source;
first and second transistors coupled to the first and second circuit elements, respectively, the first transistor operable to provide the reference current to a first output when enabled, the second transistor operable to provide the reference current to a second output when enabled, and the first and second circuit elements providing source degeneration for the first and second transistors;
and
first and second lowpass filters coupled to the first and second DACs, respectively, and operable to filter the first and second analog signals, respectively.

6. The wireless device of claim 5, further comprising:
first and second mixers operable to receive and frequency upconvert the first and second analog signals, respectively, and provide first and second modulated components, respectively.

* * * * *